(12) United States Patent
Zou et al.

(10) Patent No.: US 10,431,607 B2
(45) Date of Patent: Oct. 1, 2019

(54) DISPLAY SUBSTRATE HAVING AN ORGANIC LAYER AND FABRICATING METHOD THEREOF

(71) Applicants: BOE TECHNOLOGY GROUP CO., LTD., Beijing (CN); HEFEI XINSHENG OPTOELECTRONICS TECHNOLOGY CO., LTD., Hefei (CN)

(72) Inventors: Zhixiang Zou, Beijing (CN); Chengshao Yang, Beijing (CN); Botao Song, Beijing (CN); Yinhu Huang, Beijing (CN)

(73) Assignees: BOE TECHNOLOGY GROUP CO., LTD., Beijing (CN); HEFEI XINSHENG OPTOELECTRONICS TECHNOLOGY CO., LTD., Hefei (CN)

( * ) Notice: Subject to any disclaimer, the term of this patent is extended or adjusted under 35 U.S.C. 154(b) by 139 days.

(21) Appl. No.: 15/533,159

(22) PCT Filed: Nov. 24, 2016

(86) PCT No.: PCT/CN2016/107066
§ 371 (c)(1),
(2) Date: Jun. 5, 2017

(87) PCT Pub. No.: WO2017/215195
PCT Pub. Date: Dec. 21, 2017

(65) Prior Publication Data
US 2018/0204858 A1 Jul. 19, 2018

(30) Foreign Application Priority Data

Jun. 17, 2016 (CN) .......................... 2016 1 0440115

(51) Int. Cl.
*H01L 27/12* (2006.01)
*H01L 21/02* (2006.01)
(Continued)

(52) U.S. Cl.
CPC ...... *H01L 27/1248* (2013.01); *H01L 21/0212* (2013.01); *H01L 21/0234* (2013.01);
(Continued)

(58) Field of Classification Search
None
See application file for complete search history.

(56) References Cited

U.S. PATENT DOCUMENTS

2002/0185151 A1 12/2002 Qingyuan et al.
2006/0183394 A1 8/2006 Kim et al.
(Continued)

FOREIGN PATENT DOCUMENTS

CN 1828839 A 9/2006
CN 101042987 A 9/2007
(Continued)

OTHER PUBLICATIONS

First Office Action in the Chinese Patent Application No. 201610440115.1, dated May 28, 2018; English translation attached.
(Continued)

*Primary Examiner* — Alexander G Ghyka
(74) *Attorney, Agent, or Firm* — Intellectual Valley Law, P.C.

(57) ABSTRACT

The present application discloses a method of fabricating a display substrate having an organic layer for reducing parasitic capacitance between electrodes in different layers. The method includes forming the organic layer on a base substrate; subjecting the organic layer to a surface treatment process to descum organic residues from a surface of the organic layer; and forming a passivation layer on a side of
(Continued)

the organic layer distal to the base substrate subsequent to subjecting the organic layer to the surface treatment process.

20 Claims, 3 Drawing Sheets

(51) Int. Cl.
G02F 1/1343 (2006.01)
G02F 1/1368 (2006.01)
G02F 1/1333 (2006.01)
H01L 27/32 (2006.01)
H01L 29/786 (2006.01)
H01L 51/05 (2006.01)
G02F 1/1362 (2006.01)

(52) U.S. Cl.
CPC .. *H01L 21/02118* (2013.01); *H01L 21/02334* (2013.01); *H01L 27/1259* (2013.01); *H01L 27/1262* (2013.01); *G02F 1/1368* (2013.01); *G02F 1/13439* (2013.01); *G02F 1/133345* (2013.01); *G02F 1/136227* (2013.01); *G02F 2001/13685* (2013.01); *G02F 2001/133357* (2013.01); *G02F 2202/02* (2013.01); *G02F 2202/10* (2013.01); *G02F 2202/103* (2013.01); *G02F 2202/104* (2013.01); *H01L 27/1222* (2013.01); *H01L 27/3258* (2013.01); *H01L 27/3262* (2013.01); *H01L 27/3274* (2013.01); *H01L 29/7869* (2013.01); *H01L 29/78666* (2013.01); *H01L 29/78669* (2013.01); *H01L 29/78675* (2013.01); *H01L 29/78678* (2013.01); *H01L 51/0541* (2013.01); *H01L 51/0545* (2013.01)

(56) References Cited

U.S. PATENT DOCUMENTS

| | | |
|---|---|---|
| 2007/0224547 A1 | 9/2007 | Kido |
| 2008/0042135 A1 | 2/2008 | Ryu et al. |
| 2008/0164810 A1 | 7/2008 | Oda et al. |
| 2016/0254292 A1 | 9/2016 | Shen |
| 2017/0236837 A1 | 8/2017 | Cai et al. |

FOREIGN PATENT DOCUMENTS

| | | |
|---|---|---|
| CN | 101127358 A | 2/2008 |
| CN | 105097840 A | 11/2015 |
| CN | 105679664 A | 6/2016 |
| WO | 2016061995 A1 | 4/2016 |

OTHER PUBLICATIONS

International Search Report & Written Opinion dated Mar. 15, 2017 regarding PCT/CN2016/107066.

The extended European search report in the European Patent Application No. 16905307.1, dated Dec. 11, 2018.

FIG. 3

Forming a thin film transistor on a base substrate, including forming a gate electrode on the base substrate, forming a gate insulating layer on a side of the gate electrode distal to the base substrate, forming an active layer on a side of the gate insulating layer distal to the gate electrode, and forming a source electrode and a drain electrode on a side of the active layer distal to the gate insulating layer.

↓

Forming an organic layer on a base substrate.

↓

Forming a first electrode layer on a side of the organic layer distal to the base substrate.

↓

Subjecting the organic layer to a surface treatment process to descum organic residues from a surface of the organic layer.

↓

Forming a passivation layer on a side of the first electrode layer and the organic layer distal to the base substrate subsequent to subjecting the organic layer to the surface treatment process.

↓

Forming a second electrode layer on a side of the passivation layer distal to the organic layer.

FIG. 4

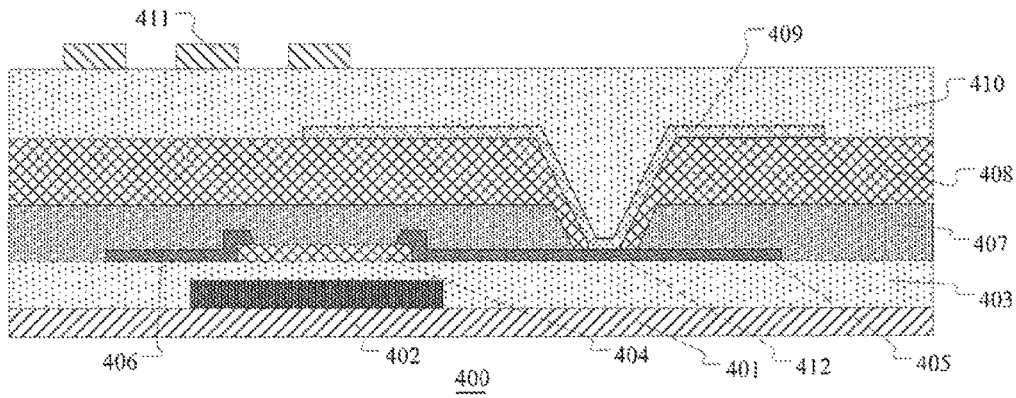

DISPLAY SUBSTRATE HAVING AN ORGANIC LAYER AND FABRICATING METHOD THEREOF

CROSS-REFERENCE TO RELATED APPLICATION

This application is a national stage application under 35 U.S.C. § 371 of International Application No. PCT/CN2016/107066 filed Nov. 24, 2016, which claims priority to Chinese Patent Application No. 201610440115.1, filed Jun. 17, 2016, the contents of which are incorporated by reference in the entirety.

TECHNICAL FIELD

The present invention relates to display technology, more particularly, a display substrate having an organic layer, and a fabricating method thereof.

BACKGROUND

Display apparatuses such as liquid crystal display (LCD) apparatuses and organic light-emitting display (OLED) apparatuses have been widely used. Typically, a liquid crystal display panel includes a counter substrate and an array substrate facing each other. Thin film transistors, gate lines, data lines, pixel electrodes, common electrodes, and common electrode lines are disposed on the array substrate and the counter substrate. Between the two substrates, a liquid crystal material is injected to form a liquid crystal layer. The array substrate and the counter substrate are sealed together using a frame sealant such as an optical clear resin.

SUMMARY

In one aspect, the present invention provides a method of fabricating a display substrate having an organic layer for reducing parasitic capacitance between electrodes in different layers, comprising forming the organic layer on a base substrate; subjecting the organic layer to a surface treatment process to descum organic residues from a surface of the organic layer; and forming a passivation layer on a side of the organic layer distal to the base substrate subsequent to subjecting the organic layer to the surface treatment process.

Optionally, the surface treatment process includes treating the surface of the organic layer with a plasma; reacting the organic residues with the plasma to form one or more reaction products; and removing the one or more reaction products from the display substrate.

Optionally, the plasma comprises one or more of nitrous oxide, oxygen, and nitrogen.

Optionally, a power level for maintaining the plasma is in a range of approximately 2 kw to approximately 25 kw.

Optionally, the power level for maintaining the plasma is in a range of approximately 8 kw to approximately 15 kw.

Optionally, the surface of the organic layer is treated with the plasma for a duration in a range of approximately 5 seconds to approximately 120 seconds.

Optionally, the surface of the organic layer is treated with the plasma for a duration in a range of approximately 10 seconds to approximately 60 seconds.

Optionally, the one or more reaction products comprise carbon oxides and nitrogen oxides; and removing the one or more reaction products is performed by vacuuming.

Optionally, the surface treatment process is performed at a temperature in a range of approximately 170 degrees to approximately 500 degrees in a system maintained with a power level in a range of approximately 1 kw to approximately 50 kw.

Optionally, the organic layer is made of one or more of polyacrylate, polysilane, polyimide, polyvinylidene fluoride, polypropylene, and polytetrafluoroethylene.

Optionally, subsequent to forming the organic layer and prior to forming the passivation layer, further comprising forming a first electrode layer on a side of the organic layer distal to the base substrate; wherein the passivation layer is formed on a side of the first electrode layer and the organic layer distal to the base substrate.

Optionally, the surface treatment process is performed subsequent to forming the first electrode layer and prior to forming the passivation layer.

Optionally, the surface treatment process is performed prior to forming the first electrode layer and prior to forming the passivation layer.

Optionally, the first electrode layer is a pixel electrode layer.

Optionally, the method further comprises forming a second electrode layer on a side of the passivation layer distal to the organic layer; wherein the second electrode layer is a common electrode layer.

Optionally, prior to forming the organic layer, the method further comprises forming a thin film transistor on the base substrate; wherein the thin film transistor is formed on a side of the organic layer proximal to the base substrate.

Optionally, forming the thin film transistor comprises forming an active layer, wherein the active layer is forming using one of a metal oxide material, amorphous silicon, polycrystalline silicon, and an organic semiconductor.

In another aspect, the present invention provides a display substrate fabricated by a method described herein.

In another aspect, the present invention provides a display panel comprising a display substrate described herein.

In another aspect, the present invention provides a display apparatus comprising a display panel described herein.

BRIEF DESCRIPTION OF THE FIGURES

The following drawings are merely examples for illustrative purposes according to various disclosed embodiments and are not intended to limit the scope of the present invention.

FIG. 3 is a flow chart illustrating a process of fabricating a display substrate in some embodiments according to the present disclosure.

FIG. 4 is a diagram illustrating the structure of a display substrate having a bottom gate-type thin film transistor in some embodiments according to the present disclosure.

DETAILED DESCRIPTION

Figure 1:
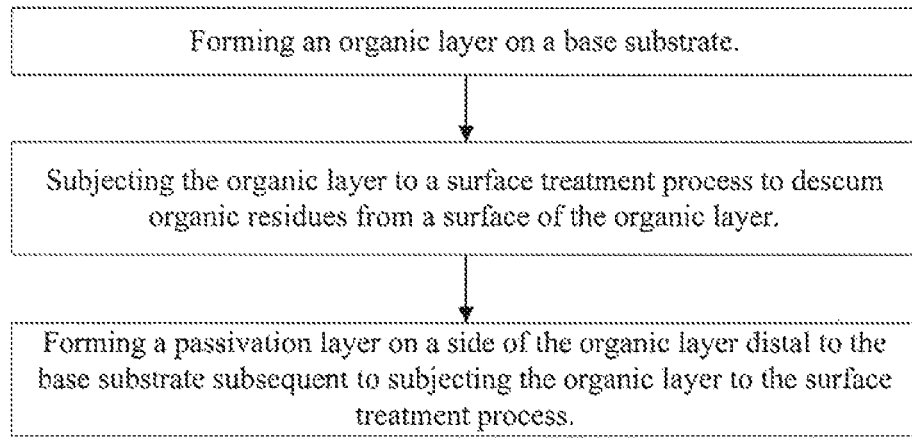
FIG. 1 is a flow chart illustrating a process of fabricating a display substrate in some embodiments according to the present disclosure.

The disclosure will now be described more specifically with reference to the following embodiments. It is to be noted that the following descriptions of some embodiments are presented herein for purpose of illustration and description only. It is not intended to be exhaustive or to be limited to the precise form disclosed.

In conventional display panels, parasitic capacitance forms between electrodes in different layers. For example, in an advance super dimension switch (ADS) liquid crystal display panel, parasitic capacitance may form between a gate electrode (or a source electrode or a drain electrode) and a pixel electrode (or a common electrode). Parasitic capacitance exerts a great effect on performance of the thin film transistor, resulting in an increased power consumption.

In some embodiments, the display substrate includes an organic layer between electrode layers to eliminate parasitic capacitance, reduce power consumption, and enhance display resolution. The organic layer also functions as a planarization layer in the display substrate. However, a process of forming the organic layer in the display substrate generates organic residues on the surface of the organic layer. The presence of the organic residues may cause certain defects in the display panel, for example, bulging of a semiconductor layer in the display substrate. Moreover, the existence of the organic residues inside the display panel also adversely affects bonding between layers and bonding between the display substrate and a frame sealant. One method to test bonding in a display panel is a "pressure cooker test," which is conducted under the conditions of 121 Celsius degrees, 100% relative humidity, and a pressure of 2 atm for a duration of 12 hours. If a display panel is not found to be defective after 12 hours under the test conditions, e.g., the sealing remains intact and the liquid crystal is not leaking, the display panel passes the pressure cooker test.

When the bonding between the display substrate and a frame sealant is affected by the presence of the organic residues, the display panel becomes less moisture resistant. For example, in a pressure cooker test, vapor may enter the display panel when the bonding becomes defective. As a result, the display panel cannot meet the requirements of the test.

Accordingly, the present invention provides, inter alia, a display substrate having an organic layer and a fabricating method thereof that substantially obviate one or more of the problems due to limitations and disadvantages of the related art. In one aspect, the present disclosure provides a method of fabricating a display substrate having an organic layer for reducing parasitic capacitance between electrodes in different layers. In some embodiments, the method includes forming an organic layer on a base substrate; subjecting the organic layer to a surface treatment process to descum organic residues from a surface of the organic layer, and forming a passivation layer on a side of the organic layer distal to the base substrate subsequent to subjecting the organic layer to the surface treatment process. Optionally, the display substrate is a display substrate in a liquid crystal display panel. Optionally, the display substrate is a display substrate in an organic light emitting diode display panel. As used herein, the term "descum" refers to a process for removing organic residues on a surface of a semiconductor layer. By removing the organic residues in the display substrate, the present method greatly improves surface condition of the display substrate, the bonding between the display substrate and a frame sealant in subsequent processes, as well as bonding between various layers in the display substrate, preventing the occurrence of bulging layers in the display substrate. In one example, the present disclosure provides a display panel having a display substrate fabricated by the present method, the display panel passes the pressure cooker test.

FIG. 1 is a flow chart illustrating a process of fabricating a display substrate in some embodiments according to the present disclosure. Referring to FIG. 1, the method in some embodiments includes forming an organic layer on a base substrate; subjecting the organic layer to a surface treatment process to descum organic residues from a surface of the organic layer, and forming a passivation layer on a side of the organic layer distal to the base substrate subsequent to subjecting the organic layer to the surface treatment process.

In some embodiments, the surface treatment process includes treating the surface of the organic layer with a plasma, reacting the organic residues with the plasma to form one or more reaction products, and removing the one or more reaction products from the display substrate. Plasma is a highly ionized and high temperature gas consisting of approximately equal numbers of positively charged ions and negatively charged electrons. It is a combination of molecules, atoms, electrons and positive ions and is considered to be a "fourth state of matter" in addition to solid, liquid, and gas. Due to its unique properties, plasma is an excellent media for intermediate reactions. In particular, many complex reactions can occur in the presence of high energy ions and atoms in excitation states in the plasma. Various types of plasmas may be formed using various types of gases. By selecting an appropriate plasma medium, various types of plasma atmosphere may be obtained, including an oxidizing atmosphere, a reducing atmosphere, and a neutral atmosphere.

Various mechanisms may be used for generating various types of plasmas. The types of plasma discharges include, but are not limited to, corona discharges, glow discharges, dielectric barrier discharges, and microwave discharges. Plasma can also be generated by applying high frequency power to a gas. For example, plasmas may be generated in a capacitively coupled plasma reactor, an inductively coupled plasma reactor, or an electron cyclotron resonance plasma reactor. Optionally, plasma may be generated by applying heat to a gas.

In some embodiments, in the surface treatment process using a plasma, high energy electrons in the plasma collide with atoms or molecules in the organic residues to produce atoms, molecules, and free radicals in excitation states. The high-energy ions and atoms in the plasma and the atoms, molecules, and free radicals in excitation states are highly active, enabling many chemical reactions with high reaction barriers. Accordingly, organic residues on the surface of the organic layer react with the plasma, generating gaseous final reaction products, which can be removed from the display substrate by vacuuming.

In some embodiments, the plasma includes one or more of nitrous oxide, oxygen, and nitrogen. Optionally, the plasma further includes one or more of an inert gas such as argon and helium for dilution.

Optionally, the surface of the organic layer is treated with a plasma having a relatively lower plasma power level. First, using a lower plasma power level is cost-effective as less energy is required for generating the plasma. Second, a relatively lower plasma corresponds to a relatively lower plasma temperature, particularly when the plasma is generated by heat. When the display substrate is treated with a plasma having a relatively lower temperature, the metal electrodes such as the gate electrode, the source electrode and the drain electrode in the display substrate are heated to a lesser degree, thus are less prone to deformation such as bulging. Third, when the surface of the organic layer is treated with a plasma having a relatively higher plasma power level, the plasma may react with the organic layer, resulting in surface unevenness. Accordingly, in some embodiments, a power level for maintaining the plasma is in a range of approximately 2 kw to approximately 25 kw. Optionally, a power level for maintaining the plasma is in a range of approximately 8 kw to approximately 15 kw, e.g., approximately 8 kw to approximately 9 kw, approximately 9 kw to approximately 10 kw, approximately 10 kw to approximately 12 kw, approximately 12 kw to approximately 14 kw, approximately 14 kw to approximately 15 kw.

Optionally, the surface of the organic layer is treated with the plasma for a duration in a range of approximately 5 seconds to approximately 120 seconds. Optionally, the surface of the organic layer is treated with the plasma for a duration in a range of approximately 10 seconds to approximately 60 seconds, e.g., approximately 10 seconds to approximately 15 seconds, approximately 15 seconds to approximately 25 seconds, approximately 25 seconds to approximately 30 seconds, approximately 30 seconds to approximately 35 seconds, approximately 35 seconds to approximately 40 seconds, approximately 40 seconds to approximately 45 seconds, approximately 45 seconds to approximately 60 seconds. Optionally, when the surface of the organic layer is treated with a relatively higher plasma power level, a relatively shorter treatment duration may be used. Optionally, when the surface of the organic layer is treated with a relatively lower plasma power level, a relatively longer treatment duration may be used.

In some embodiments, a combination of the plasma power level and the treatment duration may be selected so that organic residues are substantially removed whereas the organic layer remains substantially intact. In one example, the plasma power level and the treatment duration are selected so that organic residues are substantially removed while the organic layer remains undamaged. In another example, the plasma power level and the treatment duration are selected so that organic residues are substantially removed, and the surface of the organic layer is planarized. In another example, the plasma power level and the treatment duration are selected so that organic residues are substantially removed, and surface protrusions on the organic layer are removed. Optionally, a power level for maintaining the plasma is in a range of approximately 2 kw to approximately 25 kw, and the surface of the organic layer is treated with the plasma for a duration in a range of approximately 5 seconds to approximately 120 seconds. Optionally, a power level for maintaining the plasma is in a range of approximately 8 kw to approximately 15 kw, and the surface of the organic layer is treated with the plasma for a duration in a range of approximately 10 seconds to approximately 60 seconds.

Various appropriate organic materials may be used for making the organic layer. Examples of organic materials include, but are not limited to, polyacrylate, polysilane, polyimide, polyvinylidene fluoride, polypropylene, and polytetrafluoroethylene.

Optionally, the surface of the organic layer is treated with a plasma including one or more of nitrous oxide, oxygen, and nitrogen, and the plasma reacts with the organic residues to generate one or more reaction products including carbon oxides (e.g., carbon monoxide and carbon dioxide), nitrogen oxides (e.g., nitric oxide and nitrogen dioxide), as well as sulfur-containing gases. These gaseous reaction products may be conveniently removed by vacuuming.

Various alternative surface treatment methods may be used for descumming the organic residues from the surface of the organic layer. In one example, the surface of the organic layer is treated with a high voltage, which degenerates organic residues into small-molecule reaction products. The small-molecule reaction products are then removed from the display substrate, e.g., by vacuuming. In some embodiments, the surface treatment process is performed at a temperature in a range of approximately 170 degrees to approximately 500 degrees, and a power level (for maintaining the high voltage) in a range of approximately 1 kw to approximately 50 kw.

In some embodiments, a combination of the power level, the treatment temperature, and a treatment duration may be selected so that organic residues are substantially removed whereas the organic layer remains substantially intact. In one example, the plasma power level, the treatment temperature, and the treatment duration are selected so that organic residues are substantially removed while the organic layer remains undamaged. In another example, the plasma power level, the treatment temperature, and the treatment duration are selected so that organic residues are substantially removed, and the surface of the organic layer is planarized. In another example, the plasma power level, the treatment temperature, and the treatment duration are selected so that organic residues are substantially removed, and surface protrusions on the organic layer are removed. Optionally, the surface treatment process is performed at a temperature in a range of approximately 170 degrees to approximately 500 degrees in a system maintained with a power level in a range of approximately 1 kw to approximately 50 kw. Optionally, the surface treatment process is performed at a temperature in a range of approximately 170 degrees to approximately 500 degrees in a system maintained with a power level in a range of approximately 1 kw to approximately 50 kw, and the surface of the organic layer is treated with the plasma for a duration in a range of approximately 5 seconds to approximately 120 seconds.

In some embodiments, subsequent to forming the organic layer and prior to forming the passivation layer, the method further includes forming a first electrode layer on a side of the organic layer distal to the base substrate. The passivation layer is then formed on a side of the first electrode layer and the organic layer distal to the base substrate. Optionally, the surface treatment process is performed prior to forming the first electrode layer and subsequent to forming the passivation layer. Optionally, the surface treatment process is performed prior to forming the first electrode layer and prior to forming the passivation layer.

Optionally, the first electrode layer is a pixel electrode layer. Optionally, the method further includes forming a second electrode layer on a side of the passivation layer distal to the organic layer, the second electrode layer being a common electrode layer.

Optionally, the first electrode layer is a common electrode layer. Optionally, the method further includes forming a second electrode layer on a side of the passivation layer distal to the organic layer, the second electrode layer being a pixel electrode layer.

In one example, the surface treatment process is performed prior to forming the first electrode layer and prior to forming the passivation layer. The first electrode layer is formed on the organic layer having the organic residues removed by the surface treatment process. This design further enhances bonding between the organic layer and other layers in the display substrate including the pixel electrode layer, the common electrode layer, and the passivation layer. The final display substrate product is less prone to deformation such as bulging.

In another example, the surface treatment process is performed subsequent to forming the first electrode layer and prior to forming the passivation layer. By having this design, the surface treatment process remove not only the organic residues of the organic layer, but also other residues introduced in the formation of the first electrode layer (e.g., photoresist residues). This design greatly improves surface condition of the display substrate, and bonding between the display substrate and a frame sealant in subsequent processes, as well as bonding of the organic layer and the first electrode layer to other layers in the display substrate such as passivation layer and a second electrode layer. Moreover, the passivation layer may be optionally formed by depositing an insulating material using a plasma. Thus, a plasma reactor can be used in two sequential steps, simplifies the fabrication process.

Optionally, the method includes a first surface treatment process and a second surface treatment process. The first surface treatment process is performed prior to forming the first electrode layer and prior to forming the passivation layer. The second surface treatment process is performed subsequent to forming the first electrode layer and prior to forming the passivation layer.

Optionally, the method further includes forming a thin film transistor on a side of the organic layer proximal to the base substrate. Optionally, the thin film transistor is a top gate-type thin film transistor. Optionally, the thin film transistor is a bottom gate-type thin film transistor. Optionally, the thin film transistor is a dual gate-type thin film transistor.

Figure 2:
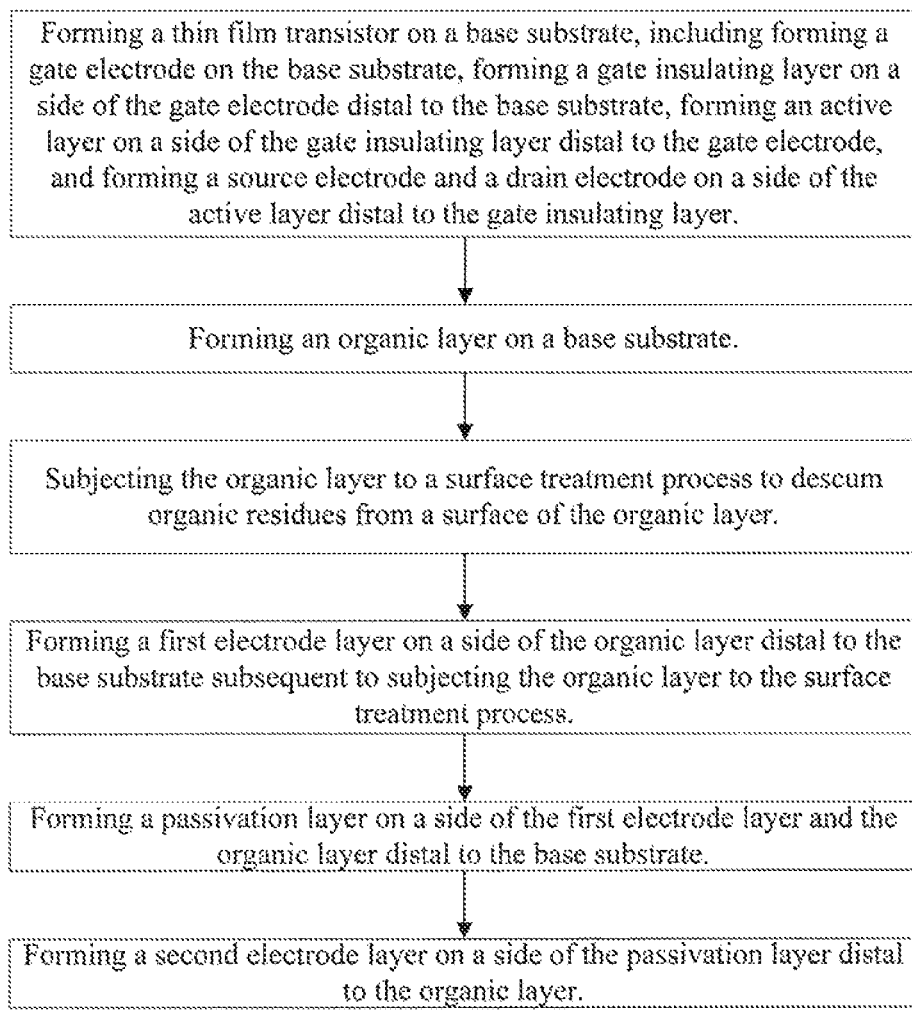
FIG. 2 is a flow chart illustrating a process of fabricating a display substrate in some embodiments according to the present disclosure.

FIG. 2 is a flow chart illustrating a process of fabricating a display substrate in some embodiments according to the present disclosure. Referring to FIG. 2, the method in some embodiments includes forming a thin film transistor on a base substrate; forming an organic layer on a base substrate; subjecting the organic layer to a surface treatment process to descum organic residues from a surface of the organic layer, forming a first electrode layer on a side of the organic layer distal to the base substrate subsequent to subjecting the organic layer to the surface treatment process; forming a passivation layer on a side of the first electrode layer and the organic layer distal to the base substrate; and forming a second electrode layer on a side of the passivation layer distal to the organic layer. Optionally, the step of forming the thin film transistor includes forming a gate electrode on the base substrate, forming a gate insulating layer on a side of the gate electrode distal to the base substrate, forming an active layer on a side of the gate insulating layer distal to the gate electrode, and forming a source electrode and a drain electrode on a side of the active layer distal to the gate insulating layer.

Optionally, the organic layer is an encapsulating layer that encapsulates the thin film transistor structure having the gate electrode, the gate insulating layer, the active layer, the source electrode, and the drain electrode. Optionally, the display substrate further includes an insulating layer encapsulates the thin film transistor structure having the gate electrode, the gate insulating layer, the active layer, the source electrode, and the drain electrode. The organic layer is formed on a side of the insulating layer distal to the thin film transistor, planarizing the surface of the display substrate.

Optionally, the first electrode layer is a pixel electrode layer, electrically connected to the drain electrode of the thin film transistor, and the second electrode layer is a common electrode layer. Optionally, the second electrode layer is a pixel electrode layer, electrically connected to the drain electrode of the thin film transistor, and the first electrode layer is a common electrode layer. Optionally, both the first electrode layer and the second electrode layer are formed on a side of the organic layer distal to the base substrate and proximal to the passivation layer, the first electrode layer being the pixel electrode layer and the second electrode layer being the common electrode layer. Optionally, the pixel electrode layer and the common electrode layer is in a same layer.

FIG. 3 is a flow chart illustrating a process of fabricating a display substrate in some embodiments according to the present disclosure. Referring to FIG. 3, the method in some embodiments includes forming a thin film transistor on a base substrate; forming an organic layer on a base substrate; forming a first electrode layer on a side of the organic layer distal to the base substrate; subjecting the organic layer to a surface treatment process to descum organic residues from a surface of the organic layer, forming a passivation layer on a side of the first electrode layer and the organic layer distal to the base substrate subsequent to subjecting the organic layer to the surface treatment process; and forming a second electrode layer on a side of the passivation layer distal to the organic layer. Optionally, the step of forming the thin film transistor includes forming a gate electrode on the base substrate, forming a gate insulating layer on a side of the gate electrode distal to the base substrate, forming an active layer on a side of the gate insulating layer distal to the gate electrode, and forming a source electrode and a drain electrode on a side of the active layer distal to the gate insulating layer.

Optionally, the organic layer is an encapsulating layer that encapsulates the thin film transistor structure having the gate electrode, the gate insulating layer, the active layer, the source electrode, and the drain electrode. Optionally, the display substrate further includes an insulating layer encapsulates the thin film transistor structure having the gate electrode, the gate insulating layer, the active layer, the source electrode, and the drain electrode. The organic layer is formed on a side of the insulating layer distal to the thin film transistor, planarizing the surface of the display substrate.

Optionally, the first electrode layer is a pixel electrode layer, electrically connected to the drain electrode of the thin film transistor, and the second electrode layer is a common electrode layer. Optionally, the second electrode layer is a pixel electrode layer, electrically connected to the drain electrode of the thin film transistor, and the first electrode layer is a common electrode layer. Optionally, both the first electrode layer and the second electrode layer are formed on a side of the organic layer distal to the base substrate and proximal to the passivation layer, the first electrode layer being the pixel electrode layer and the second electrode layer being the common electrode layer.

The thin film transistor fabricated by the methods of FIG. 2 and FIG. 3 is a bottom gate-type thin film transistor. Optionally, the thin film transistor is a top gate-type thin film transistor. Optionally, the step of forming the top gate-type thin film transistor includes forming an active layer on a base substrate; forming a source electrode and a drain electrode on a side of the active layer distal to the base substrate; forming a gate insulating layer on a side of the source electrode and the drain electrode distal to the active layer, forming a gate electrode on a side of the gate insulating layer distal to the active layer.

Optionally, the thin film transistor is a dual gate-type thin film transistor. Optionally, the step of forming the thin film transistor includes forming a first gate electrode on the base substrate, forming a first gate insulating layer on a side of the first gate electrode distal to the base substrate, forming an active layer on a side of the first gate insulating layer distal to the first gate electrode, forming a source electrode and a drain electrode on a side of the active layer distal to the first gate insulating layer, forming a second gate insulating layer on a side of the source electrode, the drain electrode, and the active layer distal to the first gate insulating layer; and forming a second gate electrode on a side of the second gate insulating layer distal to the base substrate.

Various appropriate electrode materials and various appropriate fabricating methods may be used to make the gate electrode. For example, an electrode material may be deposited on the substrate by a plasma-enhanced chemical vapor deposition (PECVD) process and patterned. Examples of appropriate electrode materials for making the gate electrode include, but are not limited to, aluminum, copper, molybdenum, chromium, aluminum copper alloy, copper molybdenum alloy, molybdenum aluminum alloy, aluminum chromium alloy, copper chromium alloy, molybdenum chromium alloy, copper molybdenum aluminum alloy, and the like.

Various appropriate insulating materials and various appropriate fabricating methods may be used to make the gate insulating layer. For example, an insulating material may be deposited on the substrate by a plasma-enhanced chemical vapor deposition (PECVD) process and patterned. Examples of appropriate insulating materials for making the gate insulating layer include, but are not limited to, silicon oxide ($SiO_x$), silicon nitride ($SiN_y$, e.g., $Si_3N_4$), silicon oxynitride ($SiO_xN_y$).

Various appropriate semiconductor materials and various appropriate fabricating methods may be used to make the active layer. For example, a semiconductor material may be deposited on the substrate by a plasma-enhanced chemical vapor deposition (PECVD) process and patterned. Examples of appropriate semiconductor materials for making the active layer includes, but are not limited to, metal oxides (e.g., ITO, IZTO, IGTO), amorphous silicon, polycrystalline silicon, organic semiconductor materials, and the like.

In some embodiments, forming the thin film transistor further includes forming an etch stop layer on a side of the active layer distal to the base substrate. Various appropriate etch stop materials and various appropriate fabricating methods may be used to make the etch stop layer. For example, an inorganic etch stop material may be deposited on the substrate by a plasma-enhanced chemical vapor deposition (PECVD) process and patterned. Examples of appropriate inorganic insulating materials for making the etch stop layer include, but are not limited to, silicon oxide ($SiO_x$), silicon nitride ($SiN_y$, e.g., $Si_3N_4$), silicon oxynitride ($SiO_xN_y$).

Various appropriate insulating materials and various appropriate fabricating methods may be used to make the insulating layer. For example, an inorganic insulating material may be deposited on the substrate by a plasma-enhanced chemical vapor deposition (PECVD) process and patterned. Examples of appropriate inorganic insulating materials for making the insulating layer include, but are not limited to, silicon oxide ($SiO_x$), silicon nitride ($SiN_y$, e.g., $Si_3N_4$), silicon oxynitride ($SiO_xN_y$).

Various appropriate insulating materials and various appropriate fabricating methods may be used to make the passivation layer. For example, an inorganic insulating material may be deposited on the substrate by a plasma-enhanced chemical vapor deposition (PECVD) process and patterned. Examples of appropriate inorganic insulating materials for making the passivation layer include, but are not limited to, silicon oxide ($SiO_x$), silicon nitride ($SiN_y$, e.g., $Si_3N_4$), silicon oxynitride ($SiO_xN_y$).

Various appropriate electrode materials and various appropriate fabricating methods may be used to make the pixel electrode. For example, an electrode material may be deposited on the substrate by a plasma-enhanced chemical vapor deposition (PECVD) process and patterned. Optionally, the pixel electrode is formed using a transparent electrode material. Examples of appropriate transparent electrode materials for making the pixel electrode include, but are not limited to, indium tin oxide, indium zinc oxide, indium gallium zinc oxide, conductive resins, graphene, carbon nanotubes, and the like.

Various appropriate electrode materials and various appropriate fabricating methods may be used to make the common electrode. For example, an electrode material may be deposited on the substrate by a plasma-enhanced chemical vapor deposition (PECVD) process and patterned. Optionally, the common electrode is formed using a transparent electrode material. Examples of appropriate transparent electrode materials for making the pixel electrode include, but are not limited to, indium tin oxide, indium zinc oxide, indium gallium zinc oxide, conductive resins, graphene, carbon nanotubes, and the like.

FIG. 4 is a diagram illustrating the structure of a display substrate having a bottom gate-type thin film transistor in some embodiments according to the present disclosure. Referring to FIG. 4, the display substrate 400 in some embodiments include a base substrate 401, a gate electrode 402 on the base substrate 401, a gate insulating layer 403 on a side of the gate electrode 402 distal to the base substrate 401, an active layer 404 on a side of the gate insulating layer 403 distal to the base substrate 401, a source electrode 405 and a drain electrode 406 on a side of the active layer 404 distal to the gate insulating layer 403, an insulating layer 407 on a side of the source electrode 405, the drain electrode 406, and the active layer 404 distal to the gate insulating layer 403, an organic layer 408 on a side of the insulating layer 407 distal to the gate insulating layer 403, a first electrode layer 409 on a side of the organic layer 408 distal to the insulating layer 407, a passivation layer 410 on a side of the first electrode layer 409 distal to the organic layer 408. The organic layer 408 is an organic layer substantially free of organic residues, and treated with a surface treatment process to descum organic residues from a surface of the organic layer.

Optionally, the insulating layer 407 is an inorganic insulating layer made of one or more of silicon oxide ($SiO_x$), silicon nitride ($SiN_y$, e.g., $Si_3N_4$), silicon oxynitride ($SiO_xN_y$).

Optionally, the organic layer 408 encapsulates the thin film transistor structure having the gate electrode 402, the gate insulating layer 403, the active layer 404, the source electrode 405, the drain electrode 406, and the insulating layer 407. After the organic layer 408 is formed, the organic layer 408 is subject to a surface treatment process to descum organic residues from a surface of the organic layer 408. The first electrode layer 409 is then formed on a side of the surface-treated organic layer 408 distal to the insulating layer 407, and the passivation layer 410 is formed on a side of the first electrode layer 409 distal to the organic layer 408. Accordingly, in some embodiments, the display substrate 400 includes a surface-treated organic layer 408 on a side of the insulating layer 407 distal to the gate insulating layer 403, and a first electrode layer 409 on a side of the surface-treated organic layer 408 distal to the insulating layer 407. Optionally, the first electrode layer 409 is a pixel electrode layer, as shown in FIG. 4.

Optionally, after the organic layer 408 is formed, and the first electrode layer 409 is formed on a side of the organic layer 408 distal to the insulating layer 407. The organic layer 408 includes a first portion covered by the first electrode layer 409 (e.g., a projection of the first portion on the base substrate 401 overlapping with that of the first electrode layer 409), and a second portion outside of the first portion. The second portion of the organic layer 408 is subject to a surface treatment process to descum organic residues from a surface of the second portion of the organic layer 408. The passivation layer 410 is then formed on a side of the first electrode layer 409 distal to the surface-treated organic layer 408. By having this design, the surface treatment process remove not only the organic residues of the organic layer itself, but also other organic residues introduced in the formation of the first electrode layer (e.g., photoresist residues). Accordingly, in some embodiments, the display substrate 400 includes an organic layer 408 on a side of the insulating layer 407 distal to the gate insulating layer 403 and a first electrode layer 409 on a side of the organic layer 408 distal to the insulating layer 407; the organic layer 408 including a first portion and a second portion outside the first portion, the second portion being surface-treated portion substantially free of organic residues, and a projection of the first portion on the base substrate 401 overlapping with that of the first electrode layer 409. Optionally, the first electrode layer 409 is electrically connected to the drain electrode 405 through a via 412 extending through the organic layer 408 and the insulating layer 407, as shown in FIG. 4.

Optionally, the display substrate 400 further includes a second electrode layer 411 on a side of the passivation layer distal to the organic layer 408. Optionally, the second electrode layer 411 is a common electrode layer. Optionally, the display substrate is a display substrate in an advance super dimension switch (ADS) liquid crystal display panel. In FIG. 4, the pixel electrode layer 409 is on a side of the passivation layer 410 proximal to the organic layer 408, and the common electrode layer 411 is on a side of the passivation layer 410 distal to the organic layer 408.

Figure 5:
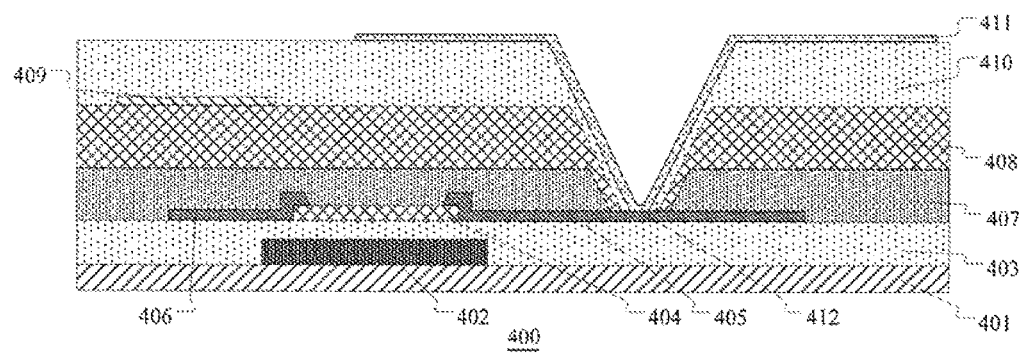
FIG. 5 is a diagram illustrating the structure of a display substrate having a bottom gate-type thin film transistor in some embodiments according to the present disclosure.

In some embodiments, the common electrode layer is on a side of the passivation layer proximal to the organic layer 408, and the pixel electrode layer is on a side of the passivation layer distal to the organic layer. FIG. 5 is a diagram illustrating the structure of a display substrate having a bottom gate-type thin film transistor in some embodiments according to the present disclosure. Referring to FIG. 5, the display substrate 400 in some embodiments includes a base substrate 401, a gate electrode 402 on the base substrate 401, a gate insulating layer 403 on a side of the gate electrode 402 distal to the base substrate 401, an active layer 404 on a side of the gate insulating layer 403 distal to the base substrate 401, a source electrode 405 and a drain electrode 406 on a side of the active layer 404 distal to the gate insulating layer 403, an insulating layer 407 on a side of the source electrode 405, the drain electrode 406, and the active layer 404 distal to the gate insulating layer 403, an organic layer 408 on a side of the insulating layer 407 distal to the gate insulating layer 403, a first electrode layer 409 on a side of the organic layer 408 distal to the insulating layer 407, a passivation layer 410 on a side of the first electrode layer 409 distal to the organic layer 408. The organic layer 408 is an organic layer substantially free of organic residues, and treated with a surface treatment process to descum organic residues from a surface of the organic layer. Optionally, as shown in FIG. 5, the first electrode layer 409 is a common electrode layer.

Optionally, the display substrate 400 further includes a second electrode layer 411 on a side of the passivation layer distal to the organic layer 408. Optionally, the second electrode layer 411 is a pixel electrode layer, as shown in FIG. 5. Optionally, the second electrode layer 411 is electrically connected to the drain electrode 405 through a via 412 extending through the organic layer 408, the insulating layer 407, and the passivation layer 410, as shown in FIG. 5.

Figure 6:
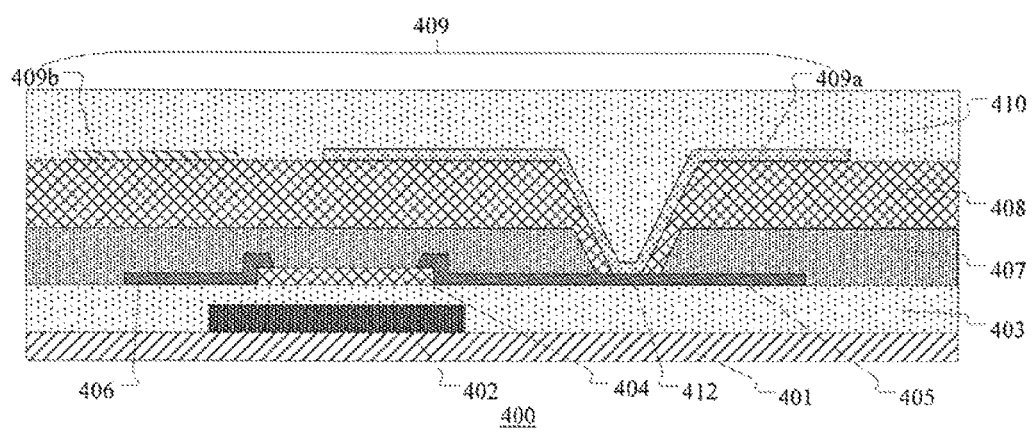
FIG. 6 is a diagram illustrating the structure of a display substrate having a bottom gate-type thin film transistor in some embodiments according to the present disclosure.

In some embodiments, both the pixel electrode layer and the common electrode layer are sandwiched between the organic layer and the passivation layer. Optionally, the pixel electrode layer and the common electrode layer are in a same layer. FIG. 6 is a diagram illustrating the structure of a display substrate having a bottom gate-type thin film transistor in some embodiments according to the present disclosure. Referring to FIG. 6, the display substrate 400 in some embodiments includes a base substrate 401, a gate electrode 402 on the base substrate 401, a gate insulating layer 403 on a side of the gate electrode 402 distal to the base substrate 401, an active layer 404 on a side of the gate insulating layer 403 distal to the base substrate 401, a source electrode 405 and a drain electrode 406 on a side of the active layer 404 distal to the gate insulating layer 403, an insulating layer 407 on a side of the source electrode 405, the drain electrode 406, and the active layer 404 distal to the gate insulating layer 403, an organic layer 408 on a side of the insulating layer 407 distal to the gate insulating layer 403, a first electrode layer 409 on a side of the organic layer 408 distal to the insulating layer 407, a passivation layer 410 on a side of the first electrode layer 409 distal to the organic layer 408. The organic layer 408 is an organic layer substantially free of organic residues, and treated with a surface treatment process to descum organic residues from a surface of the organic layer. Optionally, as shown in FIG. 6, the first electrode layer 409 includes both a pixel electrode 409a and a common electrode 409b. Optionally, the display substrate is a display substrate in an in-plane switching (IPS) liquid crystal display panel.

Figure 7:
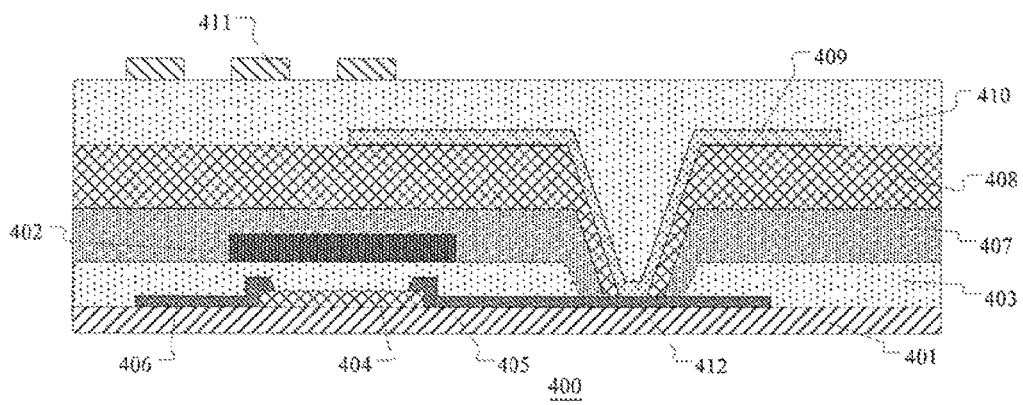
FIG. 7 is a diagram illustrating the structure of a display substrate having a top gate-type thin film transistor in some embodiments according to the present disclosure

In some embodiments, the thin film transistor in the display substrate is a top gate-type thin film transistor. FIG. 7 is a diagram illustrating the structure of a display substrate having a top gate-type thin film transistor in some embodiments according to the present disclosure. Referring to FIG. 7, the display substrate 400 in some embodiments includes a base substrate 401, an active layer 404 on the base substrate 401, a source electrode 405 and a drain electrode 406 on a side of the active layer 404 distal to the base substrate 401, a gate insulating layer 403 on a side of the source electrode 405, the drain electrode 406, and the active layer 404 distal to the base substrate 401, a gate electrode 402 on a side of the gate insulating layer 403 distal to the base substrate 401, an insulating layer 407 on a side of the gate electrode 402 distal to the gate insulating layer 403, an organic layer 408 on a side of the insulating layer 407 distal to the gate insulating layer 403, a first electrode layer 409 on a side of the organic layer 408 distal to the insulating layer 407, a passivation layer 410 on a side of the first electrode layer 409 distal to the organic layer 408. The organic layer 408 is an organic layer substantially free of organic residues, and treated with a surface treatment process to descum organic residues from a surface of the organic layer.

Optionally, the first electrode layer 409 is a pixel electrode layer, as shown in FIG. 7. The first electrode layer 409 is electrically connected to the drain electrode 405 through a via 412 extending through the organic layer 408, the insulating layer 407, and the gate insulating layer 403. Optionally, the display substrate 400 further includes a second electrode layer 411 on a side of the passivation layer 410 distal to the organic layer 408. Optionally, the second electrode layer 411 is a common electrode layer. Optionally, the display substrate is a display substrate in an advance super dimension switch (ADS) liquid crystal display panel.

Optionally, the first electrode layer is a common electrode layer, and the second electrode layer is a pixel electrode layer, the pixel electrode layer being electrically connected to the drain electrode in the thin film transistor.

Optionally, the first electrode layer includes both a pixel electrode and a common electrode, e.g., the pixel electrode and the common electrode are in a same layer (i.e., the first electrode layer).

Optionally, the thin film transistor is a dual gate-type thin film transistor. As compared to a bottom gate-type thin film transistor, the dual gate-type thin film transistor further includes a second gate electrode on a side of the source electrode and the drain electrode distal to the base substrate.

In another aspect, the present disclosure provides a display substrate fabricated by a method described herein.

In another aspect, the present disclosure provides a display panel including a display substrate described herein or fabricated by a method described herein.

In another aspect, the present disclosure provides a display apparatus including a display panel described herein. Examples of appropriate display apparatuses includes, but are not limited to, an electronic paper, a mobile phone, a tablet computer, a television, a monitor, a notebook computer, a digital album, a GPS, etc.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A method of fabricating a display substrate having an organic layer, comprising:
    forming the organic layer on a base substrate to reduce parasitic capacitance between electrodes in different layers of the display substrate;
    subsequent to forming the organic layer, forming a first electrode layer on a side of the organic layer away from the base substrate, the first electrode layer formed in direct contact with the organic layer;
    subjecting the organic layer to a surface treatment process to descum organic residues from a surface of the organic layer; and
    subsequent to forming the first electrode layer and subsequent to subjecting the organic layer to the surface treatment process, forming an inorganic insulating passivation layer on a side of the organic layer and the first electrode layer away from the base substrate, wherein the inorganic insulating passivation layer is formed in direct contact with the first electrode layer and in direct contact with the organic layer, the inorganic insulating passivation layer is formed so that an orthographic projection of the inorganic insulating passivation layer on the base substrate substantially covers orthographic projections of the first electrode layer and the organic layer.

2. The method of claim 1, wherein the surface treatment process includes treating the surface of the organic layer with a plasma;
    reacting the organic residues with the plasma to form one or more reaction products; and
    removing the one or more reaction products from the display substrate.

3. The method of claim 2, wherein the plasma comprises one or more of nitrous oxide, oxygen, and nitrogen.

4. The method of claim 2, wherein a power level for maintaining the plasma is in a range of approximately 2 kw to approximately 25 kw.

5. The method of claim 4, wherein the power level for maintaining the plasma is in a range of approximately 8 kw to approximately 15 kw.

6. The method of claim 3, wherein the surface of the organic layer is treated with the plasma for a duration in a range of approximately 5 seconds to approximately 120 seconds.

7. The method of claim 6, wherein the surface of the organic layer is treated with the plasma for a duration in a range of approximately 10 seconds to approximately 60 seconds.

8. The method of claim 3, wherein the one or more reaction products comprise carbon oxides and nitrogen oxides; and
    removing the one or more reaction products is performed by vacuuming.

9. The method of claim 1, wherein the surface treatment process is performed at a temperature in a range of approximately 170 degrees to approximately 500 degrees in a system maintained with a power level in a range of approximately 1 kw to approximately 50 kw.

10. The method of claim 1, wherein the organic layer is made of one or more of polyacrylate, polysilane, polyimide, polyvinylidene fluoride, polypropylene, and polytetrafluoroethylene.

11. The method of claim 1, wherein the inorganic insulating passivation layer comprises an inorganic material.

12. The method of claim 1, wherein the surface treatment process is performed subsequent to forming the first electrode layer and prior to forming the inorganic insulating passivation layer.

13. The method of claim 1, wherein the surface treatment process is performed prior to forming the first electrode layer and prior to forming the inorganic insulating passivation layer.

14. The method of claim 1, wherein the first electrode layer is a pixel electrode layer.

15. The method of claim 14, further comprising forming a second electrode layer on a side of the inorganic insulating passivation layer away from the organic layer;

wherein the second electrode layer is a common electrode layer.

16. The method of claim 1, prior to forming the organic layer, further comprising forming a thin film transistor on the base substrate;

wherein the thin film transistor is formed on a side of the organic layer proximal to the base substrate.

17. The method of claim 16, wherein forming the thin film transistor comprises forming an active layer;

wherein the active layer is forming using one of a metal oxide material, amorphous silicon, polycrystalline silicon, and an organic semiconductor.

18. A display substrate fabricated by a method of claim 1.

19. A display panel, comprising a display substrate of claim 18.

20. A display apparatus, comprising a display panel of claim 19.

* * * * *